(12) United States Patent
Hirose et al.

(10) Patent No.: US 7,970,370 B2
(45) Date of Patent: Jun. 28, 2011

(54) SIGNAL CONVERSION APPARATUS AND SIGNAL CONVERSION METHOD

(75) Inventors: Takayoshi Hirose, Nishinomiya (JP); Takuo Kashiwa, Nishinomiya (JP)

(73) Assignee: Furuno Electric Company Limited, Nishinomiya (JP)

( * ) Notice: Subject to any disclaimer, the term of this patent is extended or adjusted under 35 U.S.C. 154(b) by 998 days.

(21) Appl. No.: 11/483,520

(22) Filed: Jul. 11, 2006

(65) Prior Publication Data

US 2007/0015481 A1    Jan. 18, 2007

(30) Foreign Application Priority Data

Jul. 12, 2005    (JP) .................................. 2005-202473

(51) Int. Cl.
   *H04B 1/00*    (2006.01)
(52) U.S. Cl. ........................ 455/304; 455/119; 331/74
(58) Field of Classification Search .................. 455/113, 455/114.1, 114.2, 115.1, 118, 119, 141, 184.1, 455/192.1, 196.1, 227, 296, 302–304; 331/74, 331/96, 175, 112, 115
   See application file for complete search history.

(56) References Cited

U.S. PATENT DOCUMENTS

| | | | |
|---|---|---|---|
| 6,300,840 B1 * | 10/2001 | Kashiwa et al. | 331/74 |
| 7,369,834 B2 * | 5/2008 | Bargroff | 455/302 |
| 2001/0019271 A1 * | 9/2001 | Scott et al. | 324/637 |
| 2005/0176398 A1 * | 8/2005 | Maeda et al. | 455/326 |

FOREIGN PATENT DOCUMENTS

| | | |
|---|---|---|
| JP | 5-55828 A | 3/1993 |
| JP | 2002-40130 A | 2/2002 |

* cited by examiner

*Primary Examiner* — Lana N Le
*Assistant Examiner* — Ping Y Hsieh
(74) *Attorney, Agent, or Firm* — Birch, Stewart, Kolasch & Birch, LLP

(57) ABSTRACT

A signal conversion apparatus includes a local oscillator for locally generating a signal having a frequency, a phase shifter for shifting the phase of the locally generated signal output from the local oscillator by an amount determined based on a relationship between the amount of phase shift and the amount of frequency pulling, and a converter for converting an input signal by using the phase-shifted locally generated signal output from the phase shifter. The phase shifter varies impedance between the local oscillator and the converter so that the oscillating frequency of the locally generated signal output from the local oscillator remains unchanged.

15 Claims, 14 Drawing Sheets

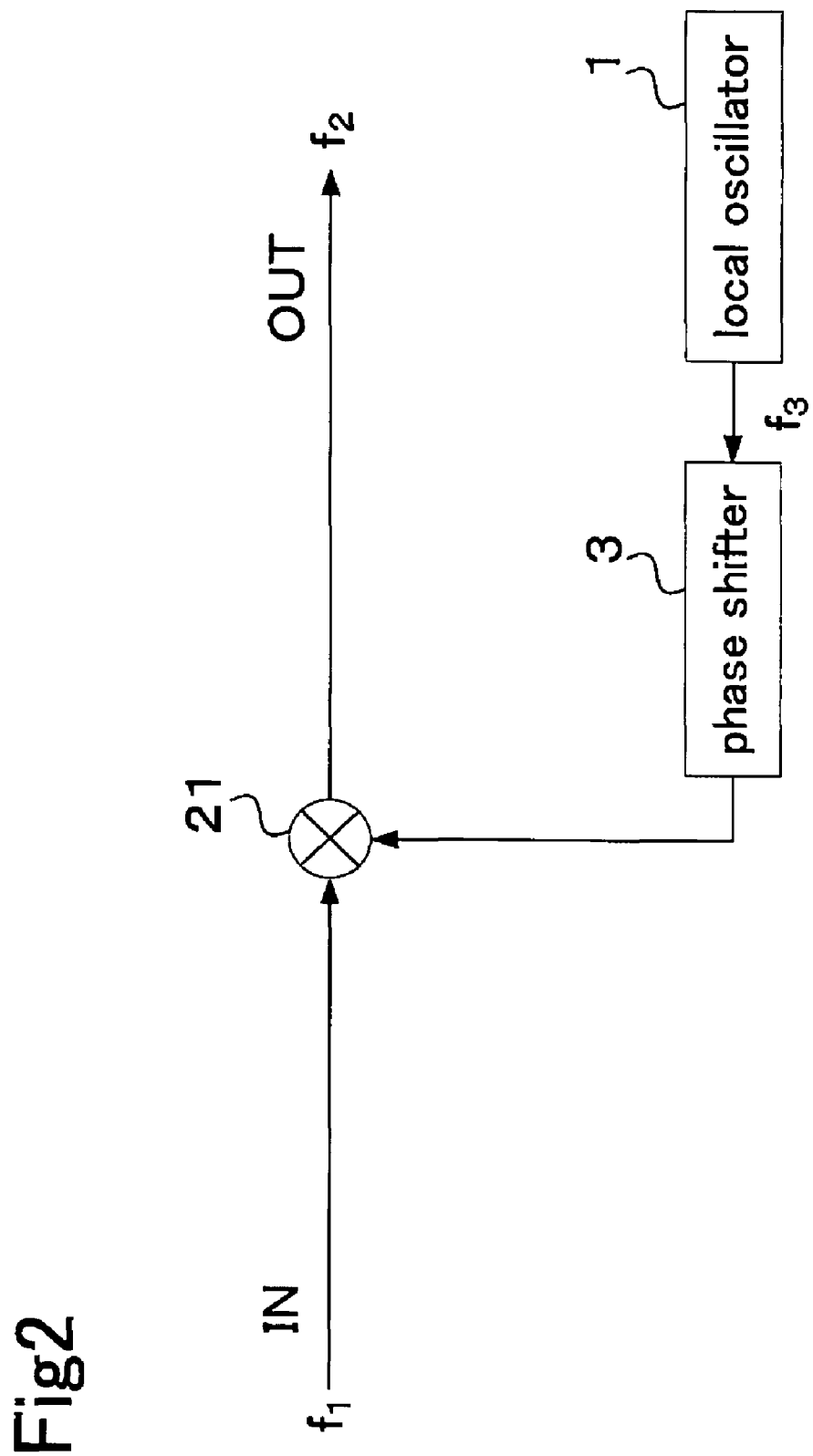

SIGNAL CONVERSION APPARATUS AND SIGNAL CONVERSION METHOD

CROSS REFERENCE OF RELATED APPLICATION

Japanese Patent Application Tokugan No. 2005-202473 is hereby incorporated by reference.

BACKGROUND OF THE INVENTION

1. Field of the Invention

The present invention relates to a signal conversion apparatus for converting an incoming signal by using a signal fed from a local oscillator. More particularly, the invention pertains to a technique for reducing an adverse influence of load variations on a local oscillator.

2. Description of the Related Art

FIG. 9 is a block diagram showing a basic configuration of a conventional frequency conversion apparatus provided with a local oscillator. The frequency conversion apparatus includes a mixer 102 which mixes an input signal having a frequency f1 and a signal having a specific frequency f3 output from a local oscillator 101 to produce two output signals having desired frequencies f2 equal to the sum and difference of the two input frequencies f1, f3 expressed by (f1+f3) and |f1−f3|.

In this kind of frequency conversion apparatus, if power of the input signal fed into the mixer 102 becomes higher than a specific value P, then the frequency f3 of the output signal of the local oscillator 101 varies with an increase in the power of the input signal. This phenomenon is known as "frequency pulling."

FIG. 10 is a diagram showing how the frequency pulling phenomenon occurs in the conventional frequency conversion apparatus, in which a horizontal axis indicates the power of the input signal fed into the mixer 102 and a vertical axis indicates the frequency f2 of each output signal of the mixer 102. As can be seen from FIG. 10, the frequency f2 of the output signal of the mixer 102 is stable at a fixed value up to a point where the power of the input signal reaches the aforementioned specific value P. The frequency pulling phenomenon occurs beyond this point, causing the output signal of the mixer 102 to take the aforementioned two different frequencies f2 which progressively increase or decrease with an increase in the power of the input signal as illustrated.

FIG. 11 is a Smith chart indicating changes in load impedance viewed from the local oscillator 101 while the frequency pulling phenomenon is taking place. When the frequency pulling phenomenon occurs with the power of the input signal exceeding the specified value P, the load impedance viewed from the local oscillator 101 varies with an increase in the power of the input signal as shown by a solid arrow in FIG. 11. For this reason, the oscillating frequency f3 of the local oscillator 101 which is apt to be affected by load conditions varies with changes in the load impedance as shown by the arrow in FIG. 11.

As the frequency f3 of the signal generated by the local oscillator 101 varies in this fashion, the frequency f2 of each output signal of the mixer 102 varies and this causes degradation in functional performance of the frequency conversion apparatus.

The frequency pulling phenomenon occurs not only in the aforementioned frequency conversion apparatus but also in all kinds of signal conversion apparatuses provided with a local oscillator, such as a modulating apparatus for modulating a signal and a demodulating apparatus for demodulating a signal. One example of such signal conversion apparatuses is shown in FIG. 12 which is a block diagram showing a basic configuration of a conventional modulating apparatus provided with a local oscillator 101 and a modulator 202. In the example of FIG. 12, an input signal (modulating signal) of the modulating apparatus is a rectangular pulse wave having a frequency f1 and a signal (carrier signal) output from the local oscillator 101 is a sine wave having a single frequency f3.

In this modulating apparatus, a modulated signal output from the modulator 202 takes two states which are hereinafter referred to as "0" and "1" states for the sake of explanation. As the modulated signal alternates between the "0" and "1" states, load conditions (or the state of the modulator 202) viewed from the local oscillator 101 successively vary, thereby causing variations in the oscillating frequency f3 of the local oscillator 101 between the "0" and "1" states of the modulated signal.

As a consequence, the modulated signal of a frequency f2 output from the modulator 202 does not become an ideal burst wave but becomes a chirped wave, so that a transmitted radio wave produced by using the modulating apparatus will have a widened occupied bandwidth, for instance. This poses a problem that a narrow-band receiver used for receiving the radio wave transmitted by using the modulating apparatus of FIG. 12 can only achieve degraded receiving performance.

There exist conventionally known techniques for solving problems caused by frequency pulling. Given below are examples of such prior art techniques widely used to cope with the problems related to the frequency pulling phenomenon.

One example of this kind of technique disclosed in Japanese Patent Application Publication No. 1993-055828 is to prevent the occurrence of the frequency pulling phenomenon by suppressing load variations in an oscillator itself. Specifically, according to the technique of this Publication, the oscillator in which a signal generated by an oscillating circuit is output through a buffer circuit is configured such that a transistor of the oscillating circuit and a transistor of the buffer circuit are connected in cascade via an impedance converter made of an inductor, for instance. This configuration of Japanese Patent Application Publication No. 1993-055828 makes it possible to reduce load variations in the oscillator itself and thereby prevents the occurrence of the frequency pulling phenomenon.

The oscillator employing this configuration to prevent frequency pulling is however expensive compared to ordinary oscillators without such a configuration. In addition, it is possible to obtain a much higher degree of freedom in design by taking measures on an output signal of an oscillator to prevent frequency pulling rather than on the oscillator itself. Accordingly, measures aimed at preventing frequency pulling are mostly often taken on the output signal of an oscillator. Described below are examples of the measures taken on the oscillator output signal.

Among various approaches directed toward preventing frequency pulling, a first approach is to stabilize the frequency of the output signal of the local oscillator 101 based on a comparison with a frequency generated by a reference oscillator which is configured not to be affected by load conditions. The reference oscillator may employ a phase-locked loop (PLL), for instance, to stabilize its output frequency. Since the frequency of the output signal of the local oscillator 101 can be stabilized in this way, this first approach makes it possible to prevent the occurrence of the frequency pulling phenomenon by keeping the local oscillator 101 unaffected by the changes in load impedance shown in FIG. 11.

A second approach aimed at preventing frequency pulling is described in Japanese Patent Application Publication No. 2002-40130, for example. FIG. 13 is a block diagram of a conventional frequency conversion apparatus employing the second approach to preventing frequency pulling. Specifically, the second approach employed in the frequency conversion apparatus shown in FIG. 13 is to reduce the degree of coupling between a local oscillator 101 and a modulator 202 by inserting multiple stages of buffer amplifiers 103 therebetween. This configuration makes it possible to preclude load impedance viewed from the local oscillator 101 from changing and thus prevent the occurrence of the frequency pulling phenomenon. FIG. 14 is a Smith chart indicating this feature of the second approach employed in the frequency conversion apparatus of FIG. 13. As shown in FIG. 14, the load impedance viewed from the local oscillator 101 remains at a fixed point without changing with variations in power of the input signal.

While the aforementioned first approach makes it possible to prevent the occurrence of the frequency pulling phenomenon, it is necessary to perform phase locking operation. This develops such problems as greater complexity of circuit configuration of the local oscillator 101 and an increase in circuit scale.

The aforementioned second approach requiring a plurality of buffer amplifiers 103 inserted between the local oscillator 101 and the mixer 102 is associated with a problem that there is no way but to increase circuit scale up to a point where a desired frequency pulling characteristic is achieved. To obtain an optimum circuit layout which provides the desired frequency pulling characteristic, it is necessary to carry out complicated adjustment and evaluation procedures requiring considerable man-hours. The second approach has another problem that it is sometimes impossible to completely prevent the occurrence of the frequency pulling phenomenon in actuality.

SUMMARY OF THE INVENTION

The present invention is intended to solve the aforementioned problems of the prior art. Accordingly, it is an object of the invention to provide a compact, low-cost signal conversion apparatus which can be manufactured by a simple process, yet featuring a capability to prevent performance degradation due to frequency pulling and output a signal having a desired property. It is another object of the invention to provide a signal conversion method which makes it possible to prevent performance degradation due to frequency pulling and output a signal having a desired property.

According to the invention, a signal conversion apparatus includes a local oscillator for locally generating a signal having a specific frequency, a phase shifter for shifting the phase of the locally generated signal output from the local oscillator by an amount determined based on a relationship between the amount of phase shift and the amount of frequency pulling, and a converter for converting an input signal by using the phase-shifted locally generated signal output from the phase shifter. The signal conversion apparatus thus configured makes it possible to positively create a load curve which prevents variations in the oscillating frequency of the locally generated signal. This configuration serves to provide a compact, low-cost signal conversion apparatus capable of preventing the occurrence of the frequency pulling phenomenon by a simple adjustment procedure.

The signal conversion apparatus of this invention refers to any apparatus which converts an input signal by using a signal output from a local oscillator. A frequency conversion apparatus, a modulating apparatus and a demodulating apparatus are examples of this kind of signal conversion apparatus. The aforementioned converter is a frequency mixing circuit in the case of a frequency conversion apparatus, a modulating circuit in the case of a modulating apparatus, a demodulating circuit in the case of a demodulating apparatus.

The aforementioned amount of phase shift by the phase shifter may be determined in different ways.

In one aspect of the invention, the aforementioned relationship between the amount of phase shift and the amount of frequency pulling based on which the amount of phase shift by the phase shifter is determined is that variations in the amount of frequency pulling progressively decrease in both magnitude and recurring cycle with an increase in the amount of phase shift.

In another aspect of the invention, the aforementioned amount of phase shift by the phase shifter is determined such that the absolute value of a reactance component of a total impedance of a resonant circuit including all impedance components which together determine the oscillating frequency of the locally generated signal remains unchanged.

In still another aspect of the invention, the aforementioned amount of phase shift by the phase shifter is so determined as to satisfy a condition expressed by the following equation before and after a change in load impedance viewed from the local oscillator:

$$\mathrm{Im}\!\left(\frac{Z_0 Z_L}{Z_0 + Z_L}\right) = \pm \mathrm{Im}\!\left(\frac{Z_0 Z_L'}{Z_0 + Z_L'}\right)$$

where
 $Z_0$: $Z_{OSC} + Z_{CKT}$
 $Z_{OSC}$: Impedance of an internal resonant circuit of the local oscillator
 $Z_{CKT}$: Impedance of a circuit including the phase shifter existing between the local oscillator and the converter
 $Z_L$: Load impedance (before changing)
 $Z_L'$: Load impedance (after changing).

In yet another aspect of the invention, the aforementioned phase shifter is configured by using a transmission line, a lumped constant circuit or a distributed constant circuit, whereby the signal conversion apparatus can be constructed with a compact, low-cost circuit configuration.

According to the present invention, the signal conversion apparatus is provided with the phase shifter for varying the impedance existing between the local oscillator and the converter by positively creating a load curve which prevents variations in the oscillating frequency of the locally generated signal output from the local oscillator. This circuit configuration makes it possible to prevent the occurrence of the frequency pulling phenomenon even when power of the input signal fed into the converter increases. As the phase shifter serves to avert the occurrence of the frequency pulling phenomenon, the circuit configuration of the invention makes it possible to manufacture a compact, low-cost signal conversion apparatus capable of outputting a signal having a desired property by a simple adjustment procedure without necessarily requiring an active circuit.

The circuit configuration of the present invention is particularly advantageous when applied to a frequency conversion device used in a magnetron radar, for example. Even when implemented to handle a signal generated by a magnetron whose oscillating frequency is unstable and signal intensity varies at short intervals, the circuit configuration of the invention serves to prevent frequency pulling and improve reliability of data contained in transmit/receive signals.

These and other objects, features and advantages of the invention will become more apparent upon a reading of the following detailed description in conjunction with the accompanying drawings.

BRIEF DESCRIPTION OF THE DRAWINGS

FIG. 2 is a block diagram showing the configuration of a frequency conversion apparatus according to the first embodiment of the invention;

DETAILED DESCRIPTION OF THE PREFERRED EMBODIMENTS OF THE INVENTION

The invention is now described with reference to specific embodiments which are illustrated in the accompanying drawings.

First Embodiment

Figure 1:
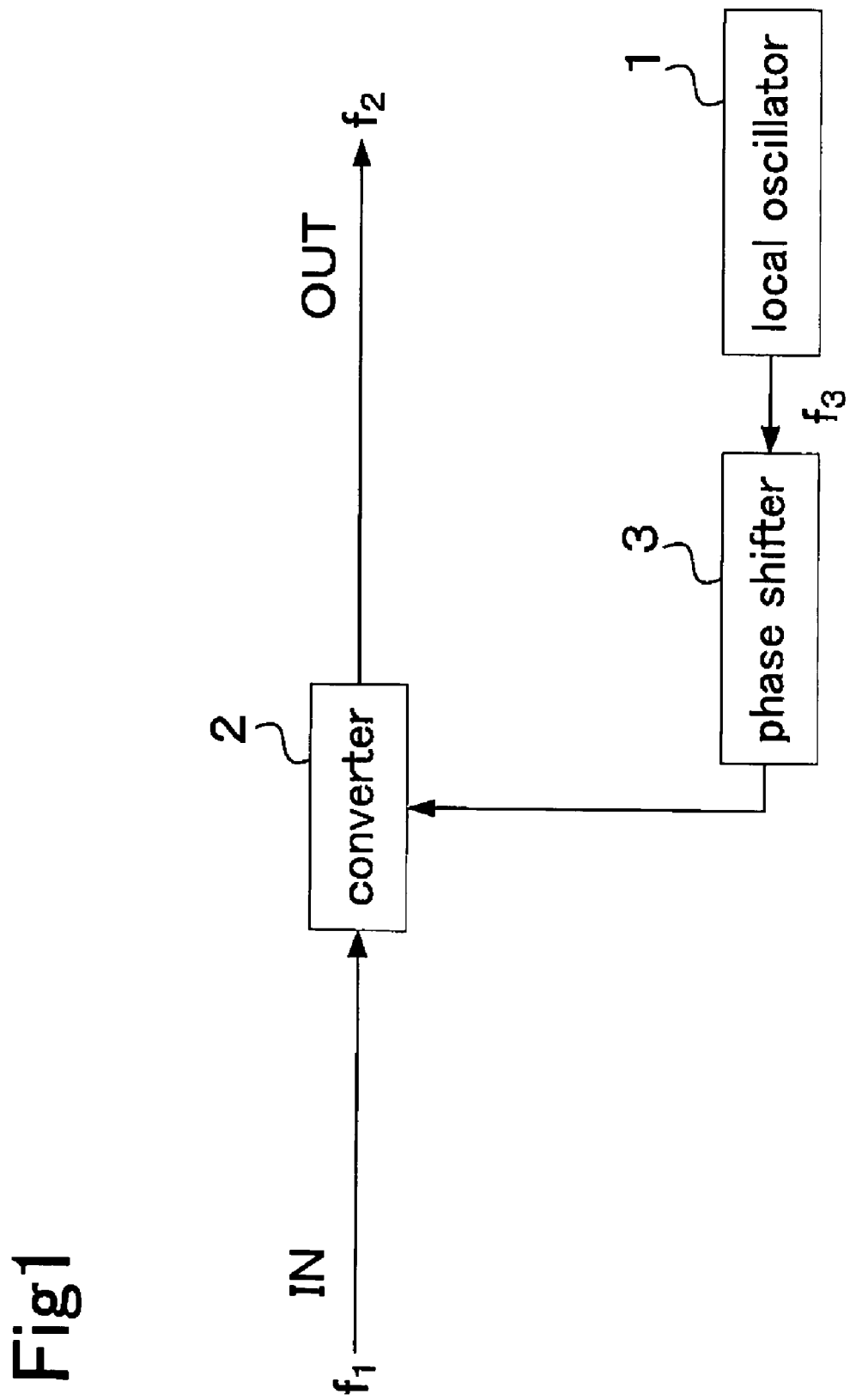
FIG. 1 is a block diagram showing the configuration of a signal conversion apparatus according to a first embodiment of the invention.

FIG. 1 is a block diagram showing the configuration of a signal conversion apparatus according to a first embodiment of the invention for converting an incoming signal by using a locally generated signal output from a local oscillator 1 while preventing the occurrence of the frequency pulling phenomenon by adjusting the amount of phase shift of the locally generated signal by means of a phase shifter 3 connected between the local oscillator 1 and a converter 2. The first embodiment of the invention is described more specifically with reference to a frequency conversion apparatus which is one example of the signal conversion apparatus.

FIG. 2 is a block diagram showing the configuration of a frequency conversion apparatus according to the first embodiment of the invention. As shown in FIG. 2, the frequency conversion apparatus includes a local oscillator 1, a mixer 21 and a phase shifter 3.

The local oscillator 1 generates and outputs a signal (locally generated signal) having a specific frequency f3. If the locally generated signal output from the local oscillator 1 has too low a signal level, the frequency conversion apparatus may be provided with an amplifier (not shown) for increasing the signal level. This amplifier may be provided at any point between the local oscillator 1 and the mixer 21. For example, the amplifier may be inserted between the local oscillator 1 and the phase shifter 3 or between the phase shifter 3 and the mixer 21. Alternatively, one or more stages of amplifiers may be inserted between the local oscillator 1 and the phase shifter 3 or between the phase shifter 3 and the mixer 21, or between the local oscillator 1 and the phase shifter 3 and between the phase shifter 3 and the mixer 21.

The mixer 21 mixes an input signal having a frequency f1 and the locally generated signal having the frequency f3 output from the local oscillator 1 to convert the frequency f1 of the input signal. Without the phase shifter 3, the mixer 21 outputs two output signals having frequencies f2 equal to the sum and difference of the two input frequencies f1, f3, that is, (f1+f3) and |f1−f3|.

The phase shifter 3 for shifting the phase of the locally generated signal output from the local oscillator 1 is built up of a transmission line, a lumped constant circuit, a distributed constant circuit, or a combination thereof. It is simplest to configure the phase shifter 3 by a transmission line because its characteristic is determined by the length of the transmission line alone. Either the lumped constant circuit or the distributed constant circuit, if used for configuring the phase shifter 3, is advantageous in that these circuits enable a reduction in size of the phase shifter 3.

Figure 3A:
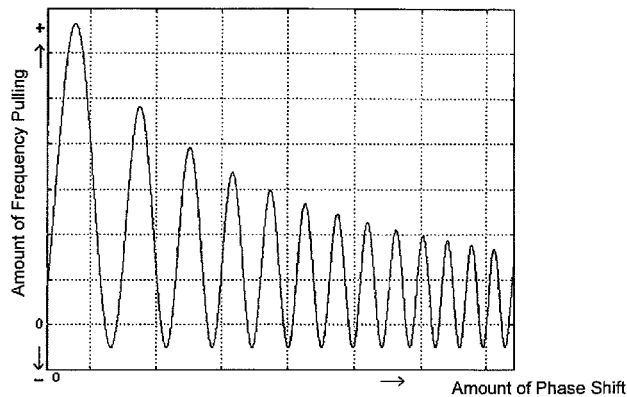
FIGS. 3A-3C are graphs showing how the amount of phase shift of a locally generated signal caused by a phase shifter and the amount of frequency pulling are related to each other.
Figure 3B:
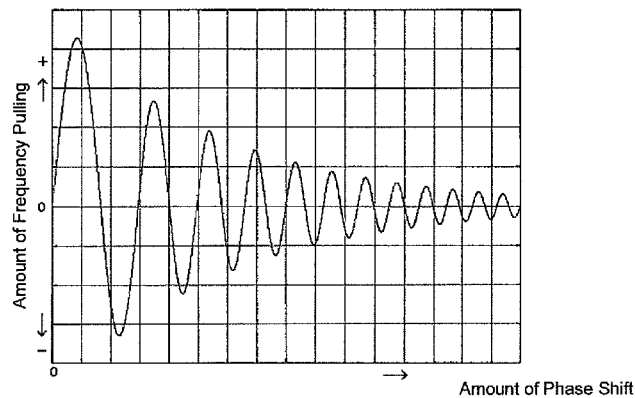
Figure 3C:
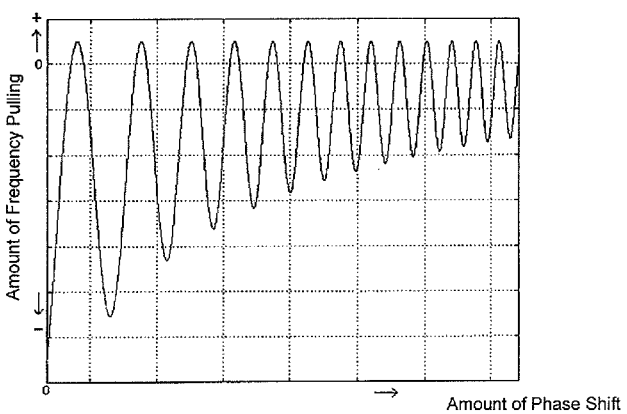

FIGS. 3A, 3B and 3C are graphs showing how the amount of phase shift of the locally generated signal caused by the phase shifter 3 and the amount of frequency pulling are related to each other. The graphs of FIGS. 3A, 3B and 3C depict a relationship between the amount of phase shift and the amount of frequency pulling observed with local oscillators having different circuit configurations.

An examination of the relationship between the amount of phase shift of the locally generated signal and the amount of frequency pulling graphed in FIGS. 3A, 3B and 3C reveals that variations in the amount of frequency pulling progressively decrease in both magnitude and recurring cycle with an increase in the amount of phase shift, wherein each curve shown in FIGS. 3A, 3B and 3C repetitively intersects a line indicating a 0 level of the amount of frequency pulling.

This suggests that the frequency pulling phenomenon can be averted by simply increasing the amount of phase shift of the locally generated signal as mush as possible provided that the frequency conversion apparatus has a sufficient internal space to accommodate this kind of phase shifter 3 and attenuation of the locally generated signal caused by the phase shift the phase shifter 3 does not pose a substantial problem. This also suggests that, in an ideal case, this phase shift approach makes it possible to prevent the frequency pulling phenomenon by simply increasing the length of the transmission line as mush as possible without requiring even a process of adjusting the amount of phase shift of the locally generated signal.

Now, a procedure for adjusting the amount of phase shift of the locally generated signal actually carried out by the phase shifter 3 of the present embodiment is described.

Figure 4:
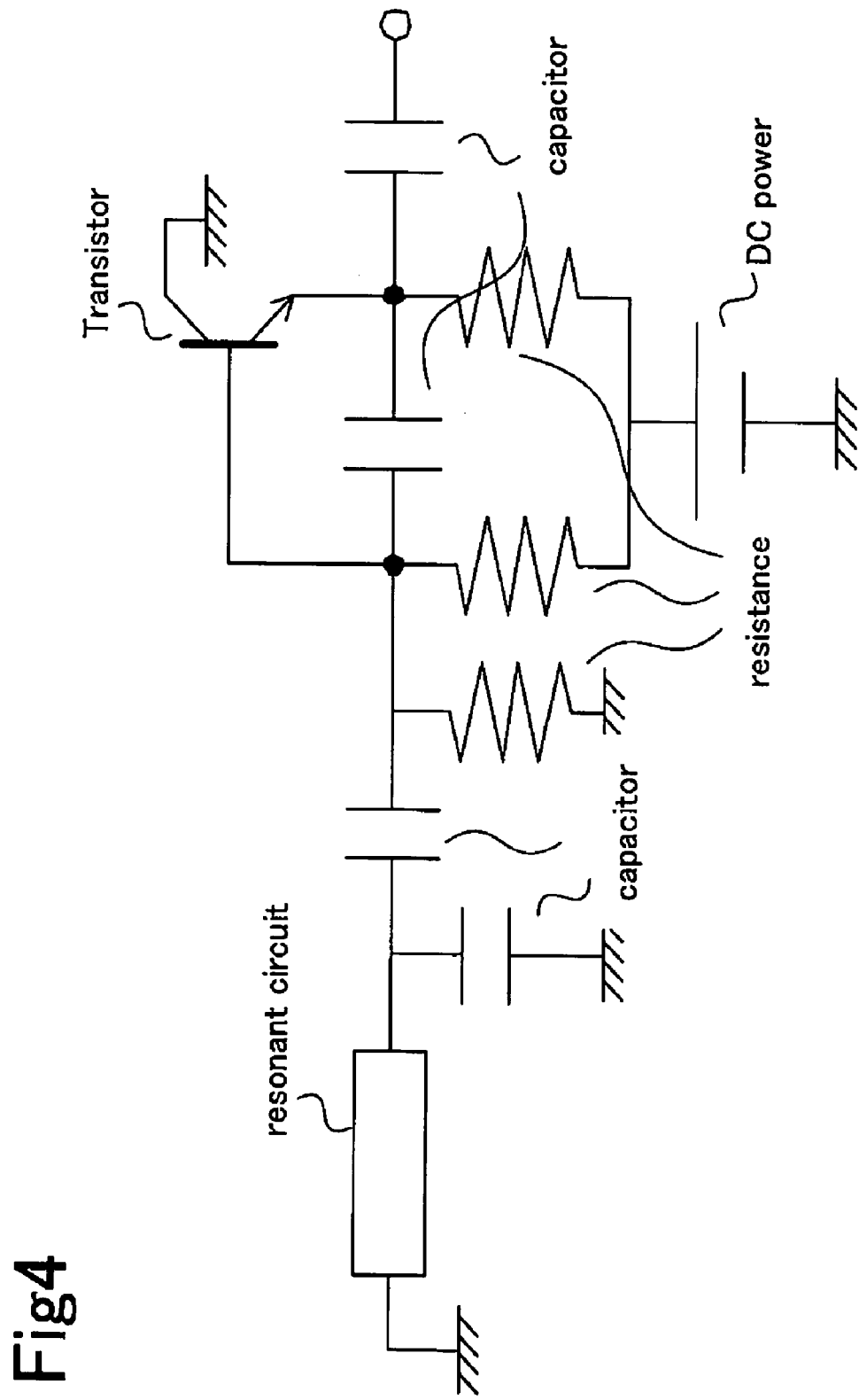
FIG. 4 is a block diagram showing a specific configuration of a local oscillator of the frequency conversion apparatus according to the first embodiment of the invention.
Figure 5:
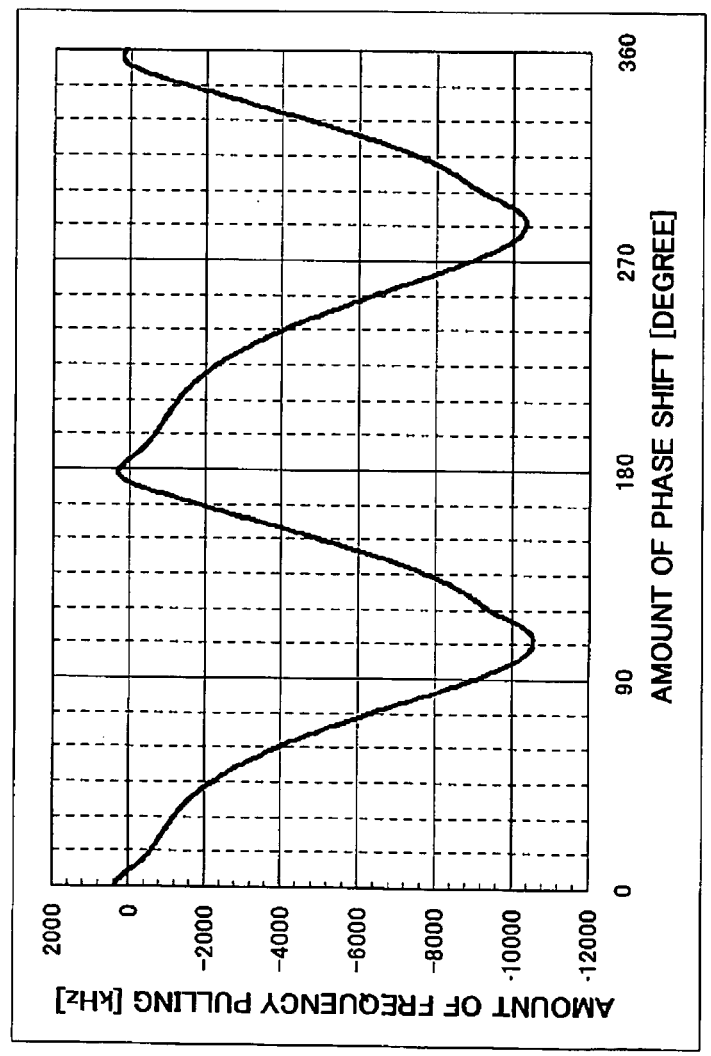
FIG. 5 is a graph showing a relationship between the amount of phase shift of the locally generated signal and the amount of frequency pulling.
Figure 6:
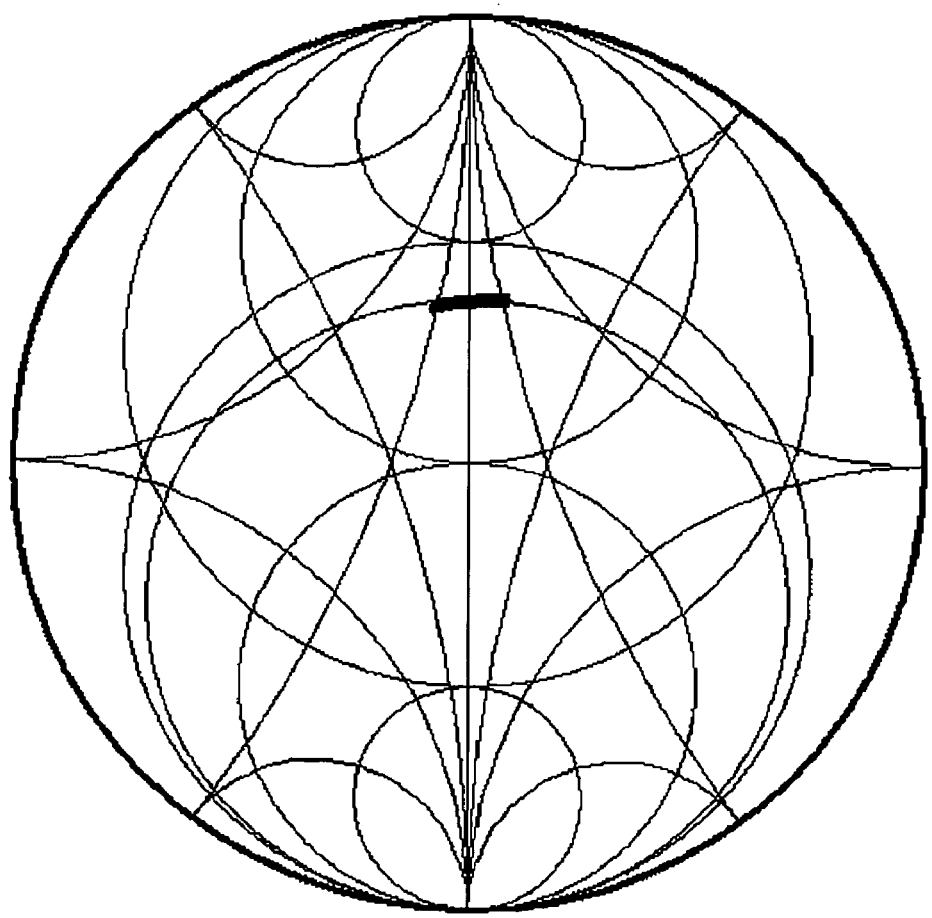
FIG. 6 is a Smith chart indicating load impedance viewed from the local oscillator when the amount of phase shift of the locally generated signal by the phase shifter is set to an optimum value.

FIG. 4 is a block diagram showing a specific configuration of the local oscillator 1 of the frequency conversion apparatus according to the first embodiment of the invention. FIGS. 5 and 6 are graphical representations of experimental results obtained with the local oscillator 1 of FIG. 4. Specifically, FIG. 5 is a graph showing a relationship between the amount of phase shift of the locally generated signal and the amount of frequency pulling, and FIG. 6 is a Smith chart indicating load impedance viewed from the local oscillator 1 when the amount of phase shift of the locally generated signal by the phase shifter 3 is set to an optimum value.

Experiments conducted by the inventors indicated that the amount of frequency pulling varies at intervals of approximately 180 degrees of changes in the amount of phase shift within a range in which the amount of phase shift by the phase shifter 3 is small as shown in FIG. 5. While the intervals of changes in the amount of phase shift at which the amount of frequency pulling varies are more or less subject to change in the circuit configuration of the local oscillator 1, this tendency was also observed with other circuit configurations of the local oscillator 1. This means that, even when the relationship between the amount of phase shift of the locally generated signal and the amount of frequency pulling is not exactly known, an optimum value of the amount of phase shift by the phase shifter 3 can be determined by performing a process of evaluating the amount of frequency pulling at intervals of approximately 180 degrees of changes in the amount of phase shift at worst.

Using the Smith chart of FIG. 6 indicating the load impedance viewed from the local oscillator 1, the inventors have verified that it is possible to prevent variations in the oscillating frequency f3 of the local oscillator 1 with the circuit configuration of FIG. 4 if the amount of phase shift by the phase shifter 3 is determined such that load conductance viewed from the local oscillator 1 varies along a constant-conductance circle as shown in FIG. 6.

Figure 13:
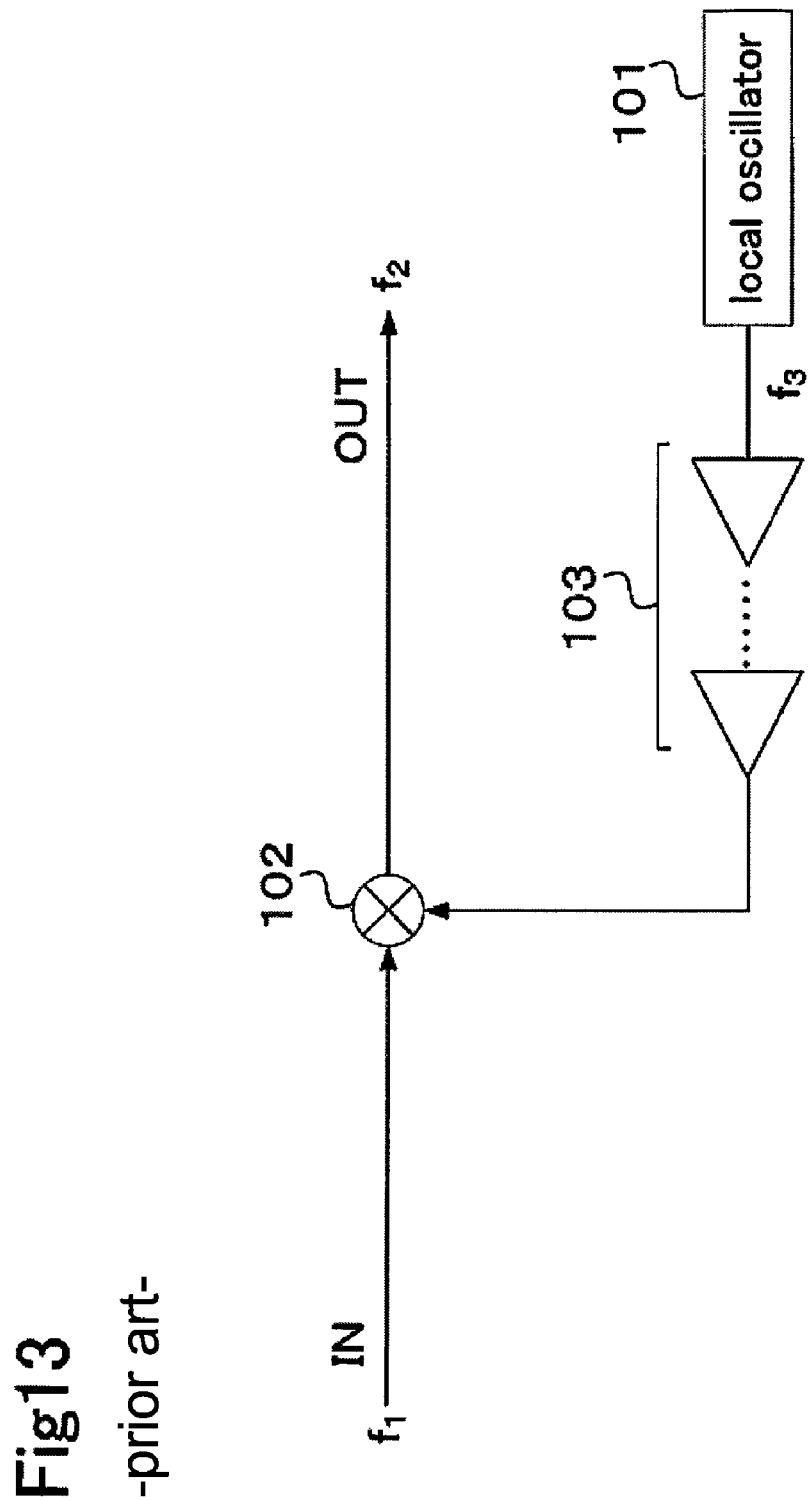
FIG. 13 is a block diagram of a conventional frequency conversion apparatus provided with a plurality of buffer amplifiers.
Figure 14:
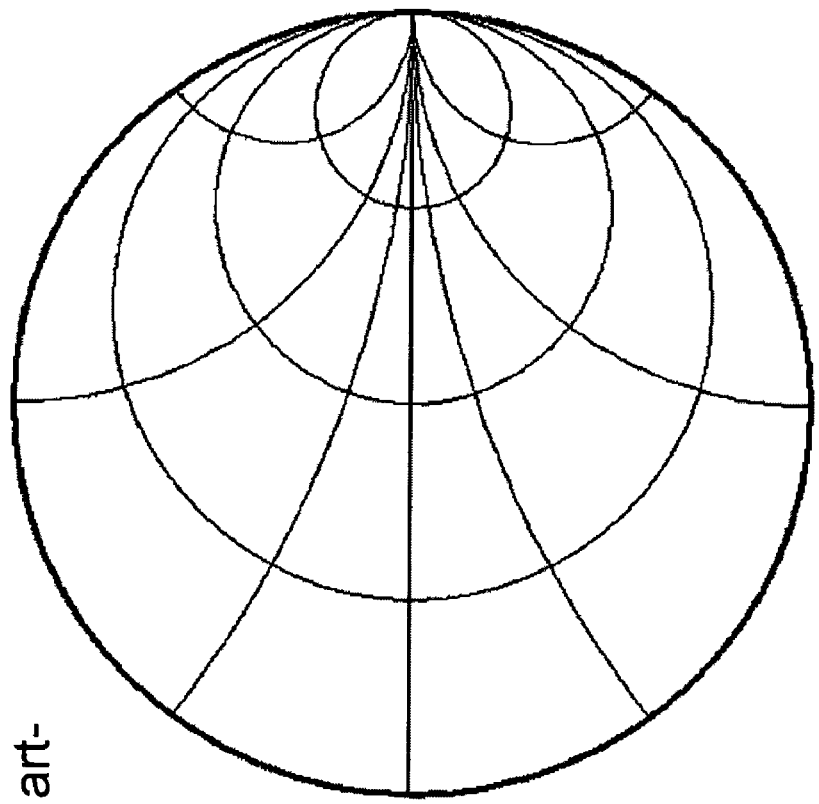
FIG. 14 is a Smith chart indicating load impedance viewed from a local oscillator of the conventional frequency conversion apparatus of FIG. 13.

An essential feature of the above-described arrangement of the present invention is that the phase shifter 3 inserted between the local oscillator 1 and the mixer 21 creates in a positive fashion a load curve which prevents variations in the oscillating frequency f3 by varying the phase of the locally generated signal output from the local oscillator 1. It would be understood that this approach of the invention distinctly differs from the earlier-mentioned prior art approach in which the load impedance viewed from the local oscillator 101 is controlled to remain at a fixed point without changing with variations in power of the input signal as described with reference to FIGS. 13 and 14.

A method of adjusting the amount of phase shift carried out by the phase shifter 3 is now described taking into account individual impedance components determining the oscillating frequency f3 of the local oscillator 1.

Figure 7:
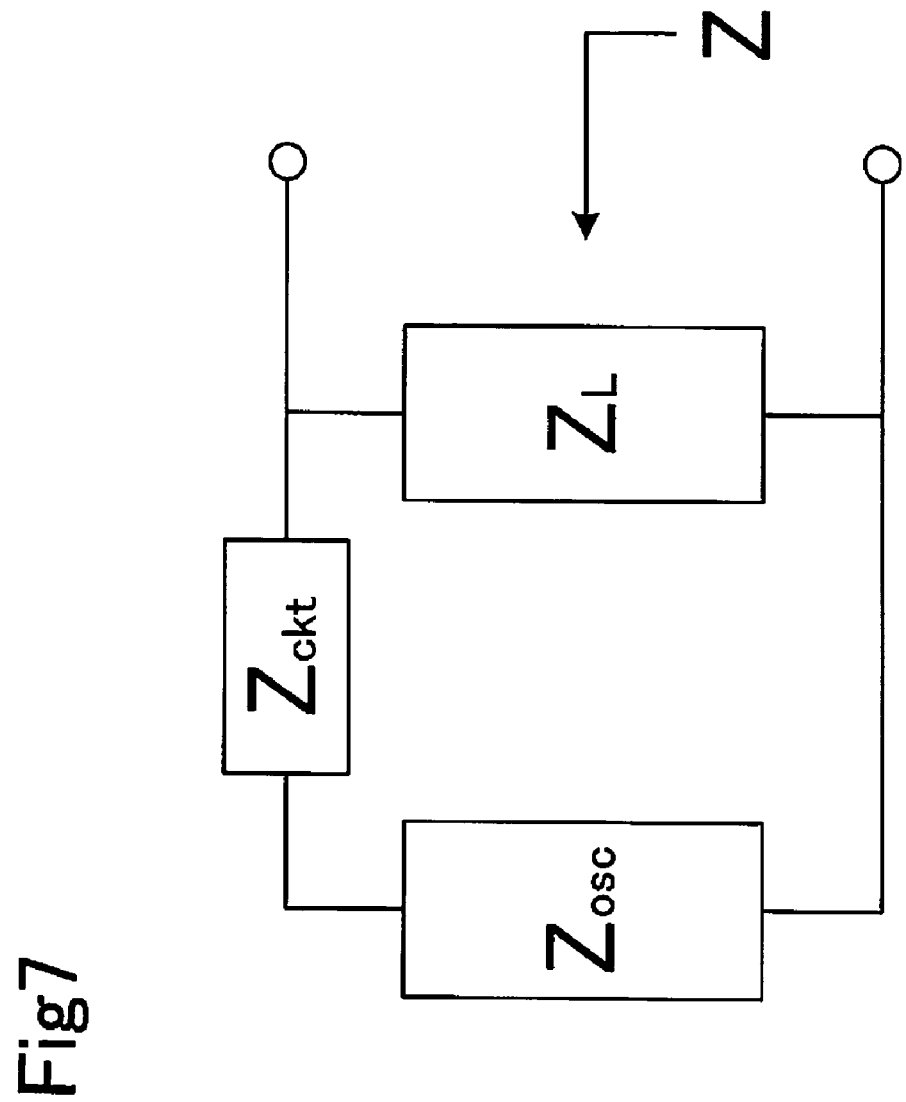
FIG. 7 is an equivalent circuit diagram showing individual impedance components which together determine the frequency of the locally generated signal output from the local oscillator.

FIG. 7 is an equivalent circuit diagram showing the impedance components which together determine the oscillating frequency f3 of the local oscillator 1.

A "true impedance" that determines the oscillating frequency f3 of the local oscillator 1 is roughly divided into three impedance components as depicted in FIG. 7. More particularly, the oscillating frequency f3 of the local oscillator 1 is determined by a resonance frequency of a "true resonant circuit" which includes impedance $Z_{OSC}$ of an internal resonant circuit of the local oscillator 1 configured therein, the load impedance $Z_L$ viewed from the local oscillator 101 and impedance $Z_{CKT}$ of a circuit (including the phase shifter 3) existing between the local oscillator 1 and the mixer 21. This means that the aforementioned load impedance $Z_L$ viewed from the local oscillator 1 is just one component of the impedance of the "true resonant circuit." In the frequency conversion apparatus of FIG. 2, the oscillating frequency f3 of the local oscillator 1 varies with changes in the load impedance $Z_L$ due to the frequency pulling phenomenon.

Here, it is assumed that the impedance of the aforementioned "true resonant circuit" has changed from $Z_1$ to $Z_2$ as a result of a change in the load impedance $Z_L$ viewed from the local oscillator 1. Oscillating conditions to be satisfied without causing a change in the oscillating frequency f3 of the local oscillator 1 when the reactance (or susceptance) of the "true resonant circuit" is zero can be expressed by equations (1a) or (1b) given below:

$$Z_1 = R_1 + jX_1 \Rightarrow Z_2 = R_2 \pm jX_1 \tag{1a}$$

or $$Y_1 = 1/Z_1 = G_1 + jB_1 \Rightarrow Y_2 = 1/Z_2 = G_2 + jB_1. \tag{1b}$$

This indicates that even when the impedance of the "true resonant circuit" has changed due to a change in the load impedance $Z_L$, the oscillating frequency f3 of the local oscillator 1 does not vary if the absolute value of the reactance (or susceptance) of the "true resonant circuit" remains unchanged. Accordingly, the amount of phase shift of the locally generated signal caused by the phase shifter 3 should ideally be adjusted such that the reactance of the "true resonant circuit" always has the same absolute value.

The impedance Z of the "true resonant circuit" can be expressed in terms of the load impedance $Z_L$ viewed from the local oscillator 1 by equation (2) below:

$$Z = \frac{Z_0 Z_L}{Z_0 + Z_L} \tag{2}$$

where $Z_0 = Z_{OSC} + Z_{CKT}$.

To prevent variations in the oscillating frequency f3 of the local oscillator 1, a condition defined by expression (3) below must be met:

$$|Im(Z)| \rightarrow |Im(Z')| \tag{3}$$

This indicates that the oscillating frequency f3 of the local oscillator 1 remains unchanged if a change in the load impedance $Z_L$ is such that the reactance of the "true resonant circuit" has the same absolute value, i.e., $X' = \pm X$.

To satisfy the aforementioned condition of expression (3) by a change in the load impedance $Z_L$ alone expressed by equations (4) below:

$$Z_L = R_L + jX_L \rightarrow Z_{L'} = R_{L'} + jX_{L'} \tag{4}$$

a condition expressed by equation (5) below must be met:

$$Im\left(\frac{Z_0 Z_L}{Z_0 + Z_L}\right) = \pm Im\left(\frac{Z_0 Z'_L}{Z_0 + Z'_L}\right) \tag{5}$$

where $Z_0$: $Z_{OSC} + Z_{CKT}$ $Z_{OSC}$: Impedance of the internal resonant circuit of the local oscillator Z_CKT: Impedance of the circuit (including the phase shifter) existing between the local oscillator and the converter (mixer)

Z_L: Load impedance (before changing)

Z_L': Load impedance (after changing).

It is recognized from the above discussion that the amount of phase shift of the locally generated signal caused by the phase shifter 3 should approximately satisfy the condition expressed by equation (5) before and after a change in the load impedance Z_L viewed from the local oscillator 1 in order to keep the oscillating frequency f3 of the local oscillator 1 unchanged. It follows that the frequency pulling phenomenon can be suppressed down to a practically acceptable level by setting the amount of phase shift of the locally generated signal within a specific approximated range satisfying the condition expressed by equation (5).

As will be appreciated from the foregoing discussion, the frequency conversion apparatus of the first embodiment makes it possible to positively create a load curve which prevents variations in the oscillating frequency f3 of the local oscillator 1 by varying the phase of the locally generated signal output from the local oscillator 1 with the aid of the phase shifter 3 inserted between the local oscillator 1 and the mixer 21 and thus averts the occurrence of the frequency pulling phenomenon.

It will also be appreciated from the foregoing discussion that the frequency conversion apparatus of the first embodiment makes it possible to minimize the amount of frequency pulling by a simple adjustment procedure because an optimum value of the amount of phase shift of the locally generated signal can be obtained by shifting the oscillating frequency f3 of the local oscillator 1 over a range of at least 180 degrees by means of the phase shifter 3. Additionally, it would be possible to reduce the amount of frequency pulling by simply adjusting the length of a transmission line depending on the oscillating frequency f3. In this case, the frequency conversion apparatus of the first embodiment would make it possible to minimize the amount of frequency pulling by simply altering circuit layout and transmission line routing without adding a dedicated circuit for preventing phase shifting.

Furthermore, even when a local oscillator which is likely to develop the frequency pulling phenomenon is employed, the frequency conversion apparatus of the first embodiment makes it possible to easily take measures to prevent frequency pulling with the provision of a phase shifter on output side of the local oscillator. Another advantage of the first embodiment is that the above-described circuit configuration makes it possible to manufacture a compact signal conversion apparatus at low cost yet providing an increased degree of freedom in circuit design.

Second Embodiment

While the invention has been described with reference to the frequency conversion apparatus taken as a typical example of the signal conversion apparatus in the first embodiment, the above-described approach of the first embodiment to preventing the frequency pulling phenomenon by the phase shifter 3 is applicable not only to the frequency conversion apparatus but similarly to every kind of signal conversion apparatus which is configured to convert an incoming signal by using a signal output from a local oscillator.

Figure 8:
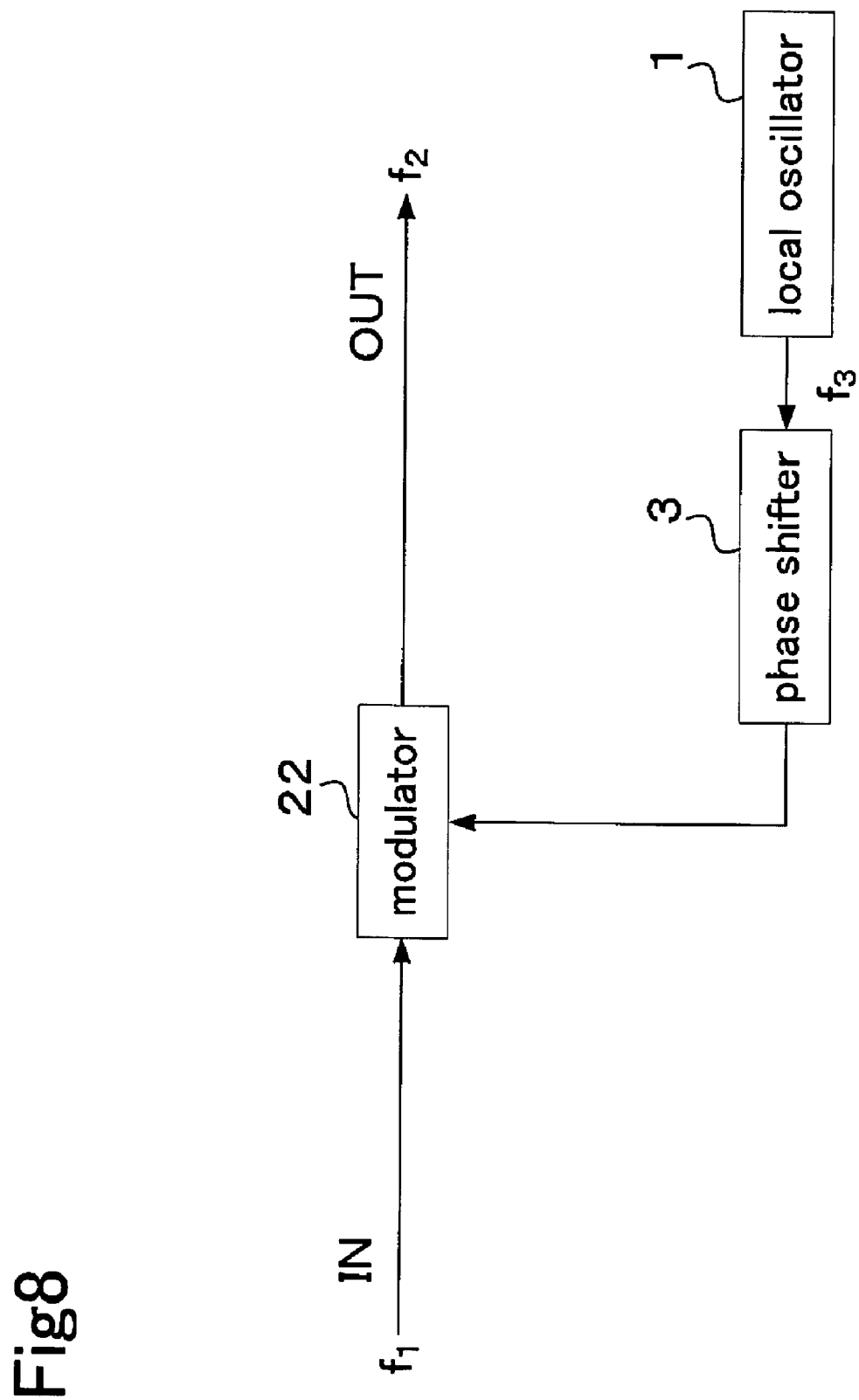
FIG. 8 is a block diagram showing the configuration of a modulating apparatus according to a second embodiment of the invention.
Figure 9:
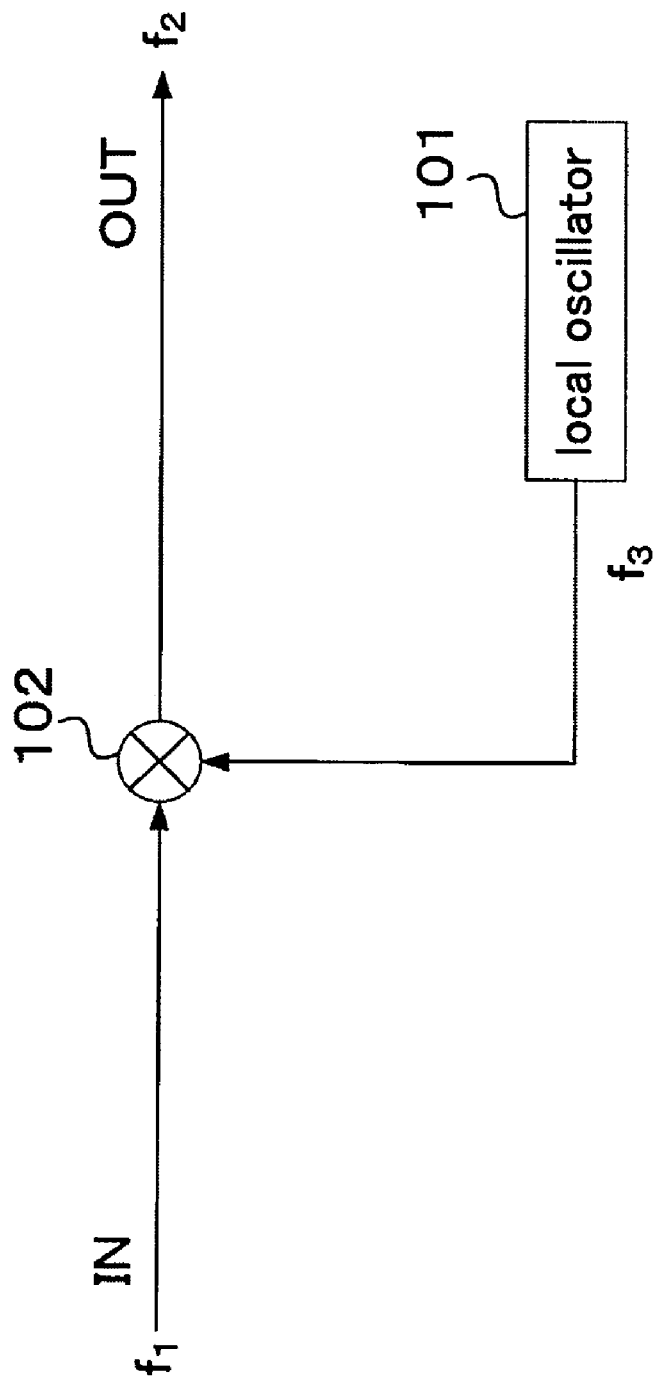
FIG. 9 is a block diagram showing a basic configuration of a conventional frequency conversion apparatus.
Figure 10:
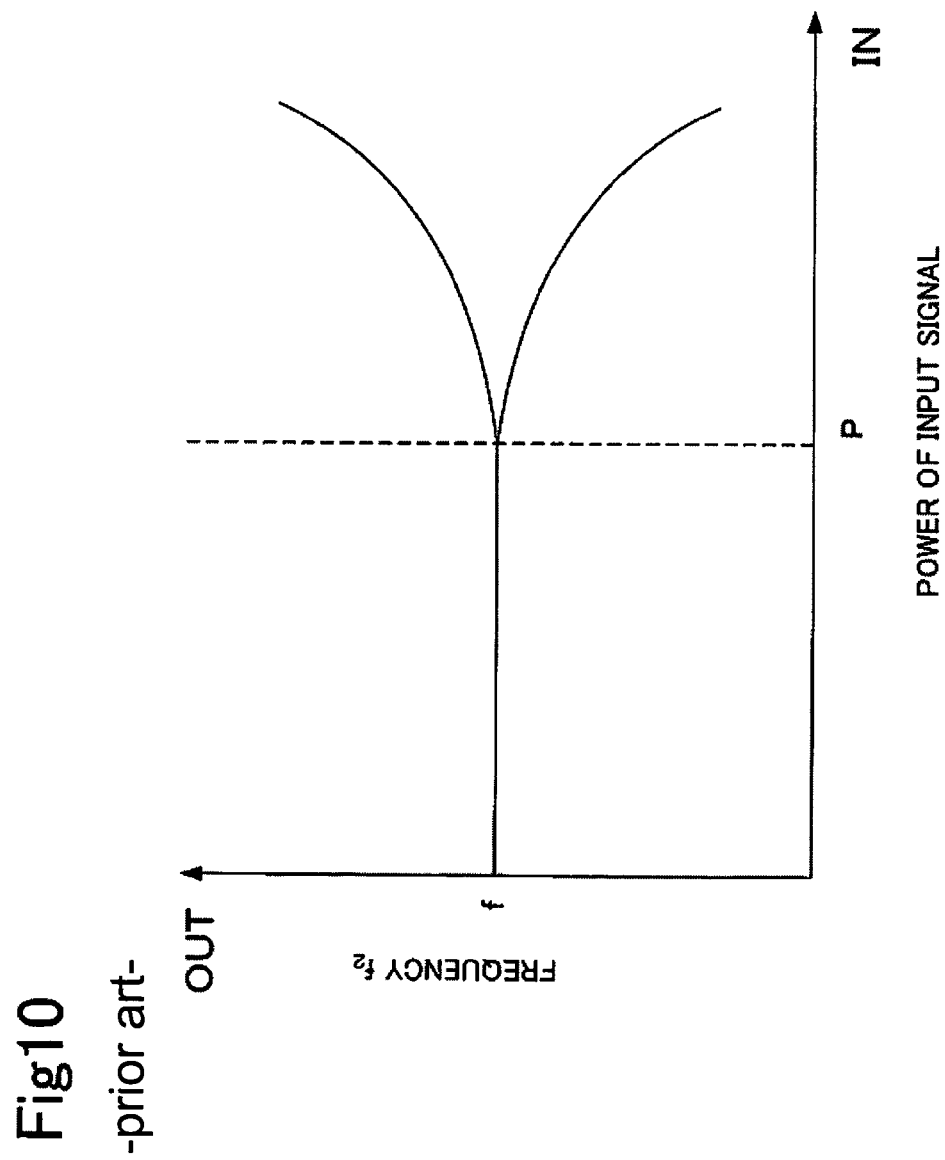
FIG. 10 is a diagram showing a frequency pulling phenomenon occurring in the conventional frequency conversion apparatus.
Figure 11:
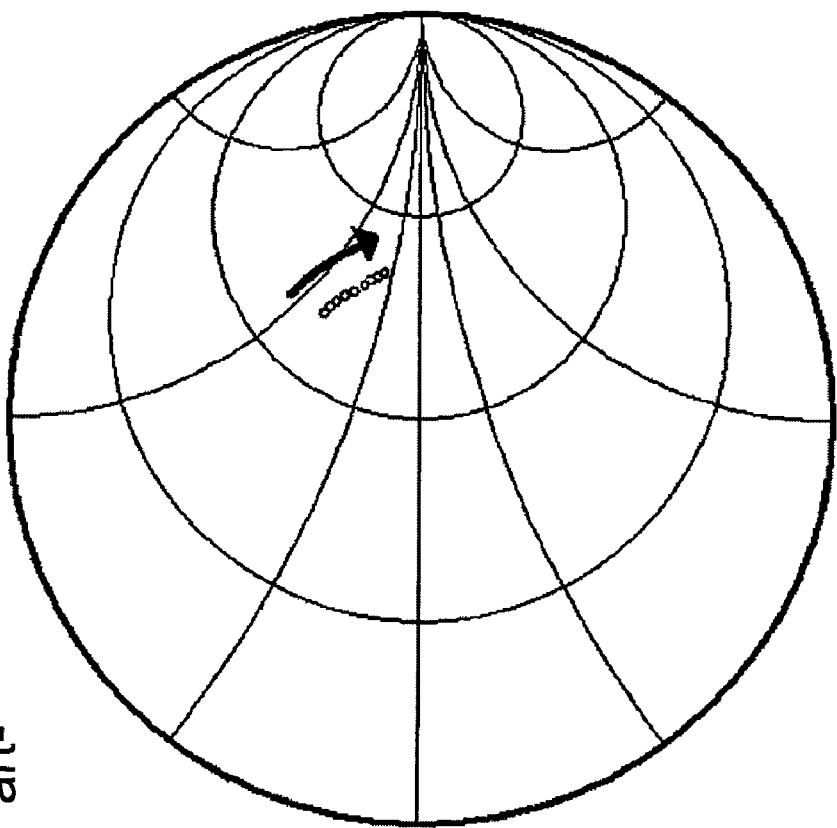
FIG. 11 is a Smith chart indicating changes in load impedance viewed from a local oscillator of the conventional frequency conversion apparatus.
Figure 12:
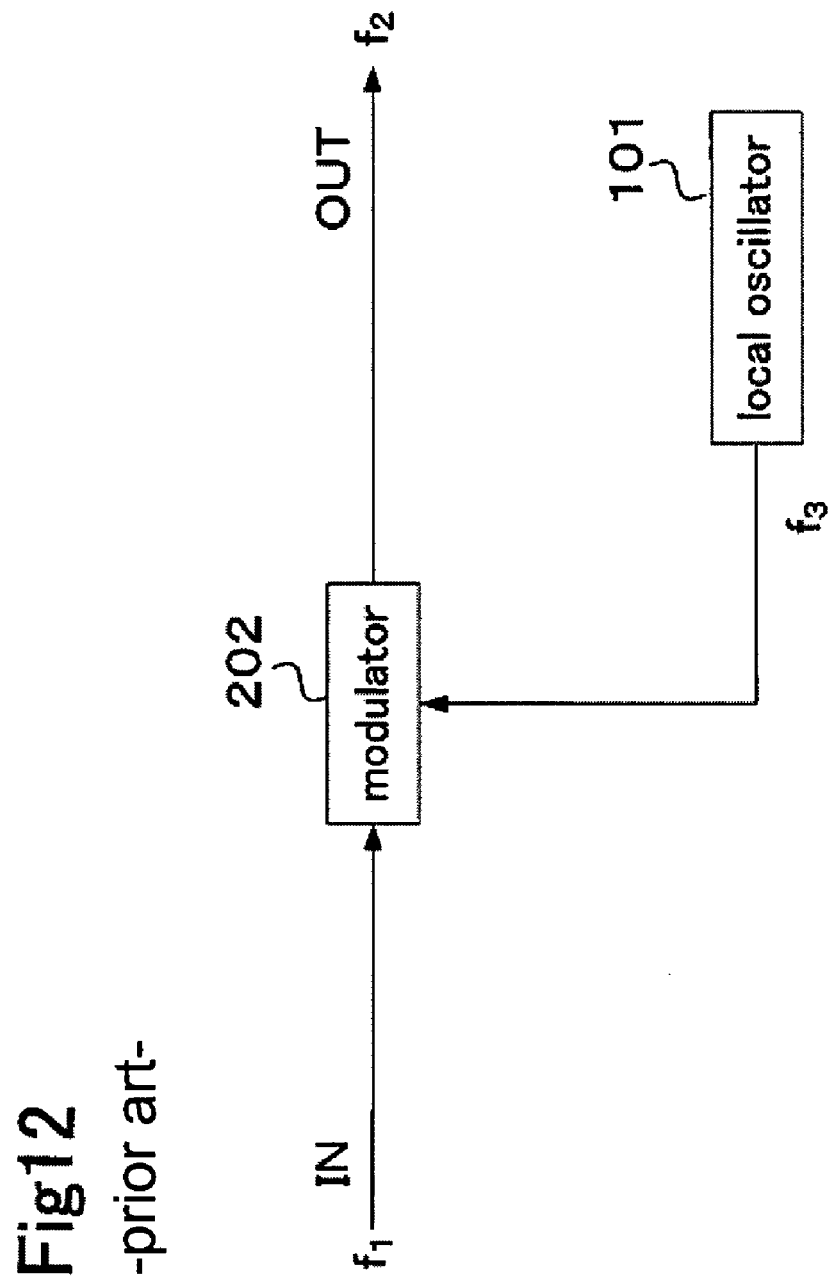
FIG. 12 is a block diagram showing a basic configuration of a conventional modulating apparatus.

FIG. 8 is a block diagram showing the configuration of a modulating apparatus according to a second embodiment of the invention which is provided with a local oscillator 1, a modulator 22 and a phase shifter 3. In the modulating apparatus of FIG. 8, an input signal (modulating signal) is a rectangular pulse wave having a frequency f1 and a signal (carrier signal) output from the local oscillator 1 is a sine wave having a single frequency f3.

In this modulating apparatus, a modulated signal output from the modulator 22 takes two states which are hereinafter referred to as "0" and "1" states. As the modulated signal alternates between the "0" and "1" states, load conditions (or the state of the modulator 22) viewed from the local oscillator 1 could successively vary, thereby causing the frequency pulling phenomenon to occur.

According to the invention, however, variations in the oscillating frequency f3 of the local oscillator 1 caused by the frequency pulling phenomenon occurring when the modulated signal alternates between the "0" and "1" states can be minimized by adjusting the amount of phase shift of the locally generated signal caused by the phase shifter 3 in various ways as described with reference to the first embodiment so that the oscillating frequency f3 remains unchanged whether the modulated signal is in the "0" state or "1" state.

This approach of the second embodiment makes it possible to obtain an ideal burst wave having a desired characteristic as the modulated signal of a frequency f2 output from the modulator 22 without developing the earlier-mentioned conventional problem of widening occupied bandwidth of a transmitted radio wave. The invention produces the same advantageous effect when applied to a demodulating apparatus as well.

What is claimed is:

1. A signal conversion apparatus for converting an input signal comprising:
   a local oscillator for locally generating a signal having a frequency;
   a phase shifter that shifts the phase of the locally generated signal output from said local oscillator by an amount determined according to a relationship between phase shift and frequency pulling such that the absolute value of a reactance of a load impedance, viewed from the local oscillator, remains unchanged when the load impedance changes; and
   a converter for converting the input signal by using the phase-shifted locally generated signal output from said phase shifter.

2. The signal conversion apparatus according to claim 1, wherein said reactance of a load impedance includes a reactance component of a total impedance of a resonant circuit including all impedance components which together determine the oscillating frequency of the locally generated signal.

3. The signal conversion apparatus according to claim 2, wherein said converter is a mixer for converting the frequency of the input signal by mixing the input signal with the phase-shifted locally generated signal output from said phase shifter.

4. The signal conversion apparatus according to claim 2, wherein said converter is a modulator for modulating the input signal by using the phase-shifted locally generated signal output from said phase shifter.

5. The signal conversion apparatus according to claim 2, wherein said converter is a demodulator for demodulating the input signal by using the phase-shifted locally generated signal output from said phase shifter.

6. The signal conversion apparatus according to claim 1, wherein the amount of phase shift by said phase shifter satisfies a condition expressed by the following equation before and after a change in load impedance viewed from said local oscillator:

$$\mathrm{Im}\left(\frac{Z_0 Z_L}{Z_0 + Z_L}\right) = \pm \mathrm{Im}\left(\frac{Z_0 Z'_L}{Z_0 + Z'_L}\right)$$

where $Z_0$: $Z_{OSC} + Z_{CKT}$, $Z_{OSC}$: Impedance of an internal resonant circuit of said local oscillator, $Z_{CKT}$: Impedance of a circuit including said phase shifter existing between said local oscillator and said converter, $Z_L$: Load impedance before changing, and $Z_L'$: Load impedance after changing.

7. The signal conversion apparatus according to claim 6, wherein said converter is a mixer for converting the frequency of the input signal by mixing the input signal with the phase-shifted locally generated signal output from said phase shifter.

8. The signal conversion apparatus according to claim 6, wherein said converter is a modulator for modulating the phase-shifted locally generated signal output from said phase shifter by using the input signal.

9. The signal conversion apparatus according to claim 6, wherein said converter is a demodulator for demodulating the input signal by using the phase-shifted locally generated signal output from said phase shifter.

10. The signal conversion apparatus according to claim 1, wherein said converter is a mixer for converting the frequency of the input signal by mixing the input signal with the phase-shifted locally generated signal output from said phase shifter.

11. The signal conversion apparatus according to claim 1, wherein said converter is a modulator for modulating the phase-shifted locally generated signal output from said phase shifter by using the input signal.

12. The signal conversion apparatus according to claim 1, wherein said converter is a demodulator for demodulating the input signal by using the phase-shifted locally generated signal output from said phase shifter.

13. A signal conversion method for converting an input signal by using a locally generated signal output from a local oscillator, said signal conversion method comprising the steps of:

generating the locally generated signal having a frequency;

shifting the phase of the locally generated signal by an amount determined according to a relationship between phase shift and frequency pulling such that the absolute value of a reactance of a load impedance, viewed from the local oscillator, remains unchanged when the load impedance changes; and converting the input signal by using the phase-shifted locally generated signal.

14. The signal conversion method according to claim 13, wherein said reactance of a load impedance includes a reactance component of a total impedance of a resonant circuit including all impedance components which together determine the oscillating frequency of the locally generated signal.

15. The signal conversion method according to claim 13, wherein the amount of phase shift satisfies a condition expressed by the following equation before and after a change in load impedance viewed from said local oscillator:

$$\mathrm{Im}\left(\frac{Z_0 Z_L}{Z_0 + Z_L}\right) = \pm \mathrm{Im}\left(\frac{Z_0 Z'_L}{Z_0 + Z'_L}\right)$$

where $Z_0$: $Z_{OSC} + Z_{CKT}$, $Z_{OSC}$: Impedance of an internal resonant circuit of said local oscillator, $Z_{CKT}$: Impedance of a circuit including a phase shifter existing between said local oscillator and a converter, $Z_L$: Load impedance before changing, and $Z_L'$: Load impedance after changing.

* * * * *